US011711942B2

(12) United States Patent
Cha et al.

(10) Patent No.: US 11,711,942 B2
(45) Date of Patent: Jul. 25, 2023

(54) DISPLAY DEVICE

(71) Applicant: Samsung Display Co., Ltd., Yongin-si (KR)

(72) Inventors: Gwangmin Cha, Hwaseong-si (KR); Woong Sik Kim, Hwaseong-si (KR); Jin-Su Byun, Seoul (KR); Sanghyun Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 602 days.

(21) Appl. No.: 16/821,834

(22) Filed: Mar. 17, 2020

(65) Prior Publication Data

US 2020/0388789 A1    Dec. 10, 2020

(30) Foreign Application Priority Data

Jun. 10, 2019    (KR) .......................... 10-2019-0067771

(51) Int. Cl.
| | | |
|---|---|---|
| *H01L 21/00* | (2006.01) | |
| *H10K 50/858* | (2023.01) | |
| *H10K 50/85* | (2023.01) | |
| *H10K 59/40* | (2023.01) | |
| *H10K 59/122* | (2023.01) | |

(52) U.S. Cl.
CPC .......... *H10K 50/858* (2023.02); *H10K 50/85* (2023.02); *H10K 59/122* (2023.02); *H10K 59/40* (2023.02)

(58) Field of Classification Search
CPC ............... H01L 51/5275; H01L 27/323; H01L 27/3246; H01L 51/5262
See application file for complete search history.

(56) References Cited

U.S. PATENT DOCUMENTS

2019/0165061 A1\*    5/2019    Jung ................... H01L 27/3218

FOREIGN PATENT DOCUMENTS

| JP | 6352002 B2 | 7/2018 |
|---|---|---|
| KR | 10-1887371 B1 | 8/2018 |

\* cited by examiner

*Primary Examiner* — Richard A Booth
(74) *Attorney, Agent, or Firm* — Lewis Roca Rothgerber Christie LLP

(57) ABSTRACT

A display device may include a first electrode, a pixel defining layer disposed on the first electrode, the pixel defining layer having a pixel opening that exposes the first electrode, an emission layer disposed in the pixel opening and on the first electrode, a second electrode disposed on the emission layer, a first refractive layer disposed on the second electrode and being an organic refractive layer, a second refractive layer disposed on the first refractive layer and being an organic refractive layer, the second refractive layer having a first opening that overlaps the pixel opening, and a third refractive layer disposed on the second refractive layer, the third refractive layer having a second refractive index greater than a first refractive index of the second refractive layer.

19 Claims, 9 Drawing Sheets

DISPLAY DEVICE

CROSS-REFERENCE TO RELATED APPLICATION

This application claims priority to and the benefit of Korean Patent Application No. 10-2019-0067771, filed on Jun. 10, 2019 in the Korean Intellectual Property Office (KIPO), the entire disclosure of which is incorporated herein by reference.

BACKGROUND

1. Field

Embodiments relate to a display device. More particularly, embodiments relate to a display device having improved light emitting efficiency.

2. Description of the Related Art

Generally, an organic light emitting display device may include an organic light emitting diode having two electrodes facing each other and an emission layer formed between the electrodes. In the organic light emitting display device, it is generally desirable for light generated from the emission layer to be directed toward a user located in a front direction of the organic light emitting display device. However, because light generated from the emission layer generally travels in a plurality of directions including the front direction and a lateral direction of the organic light emitting display device, brightness in the front direction (in which the user is located) may be low.

SUMMARY

An aspect according to embodiments of the present disclosure is directed toward a display device having improved light emitting efficiency.

A display device according to embodiments may include a first electrode, a pixel defining layer on the first electrode, the pixel defining layer having a pixel opening that exposes the first electrode, an emission layer in the pixel opening and on the first electrode, a second electrode on the emission layer, a first refractive layer on the second electrode and being an organic refractive layer, a second refractive layer on the first refractive layer and being an organic refractive layer, the second refractive layer having a first refractive index and having a first opening that overlaps the pixel opening, and a third refractive layer on the second refractive layer, the third refractive layer having a second refractive index greater than a first refractive index of the second refractive layer.

In an embodiment, each of the first refractive layer and the second refractive layer may have a hydrophobic surface.

In an embodiment, an inclination angle of a sidewall of the second refractive layer with respect to an upper surface of the first refractive layer may be an acute angle.

In an embodiment, the second refractive layer may include a plurality of refractive patterns.

In an embodiment, the second refractive layer may include a first refractive pattern having the first opening, and a second refractive pattern around the first refractive pattern and having a second opening greater in area than the first opening.

In an embodiment, the first refractive pattern may have a ring shape around the pixel opening in a plan view. The second refractive pattern may have a grid shape overlapping the pixel defining layer in a plan view.

In an embodiment, a width of the second refractive pattern may be greater than a width of the first refractive pattern.

In an embodiment, the second refractive layer may further include a third refractive pattern around the second refractive pattern and having a third opening greater in area than the second opening.

In an embodiment, a width of the first refractive pattern, a width of the second refractive pattern, and a width of the third refractive pattern may be substantially equal to each other.

In an embodiment, the first refractive layer may overlap the second electrode.

In an embodiment, the first refractive layer may have a planarized upper surface.

In an embodiment, the third refractive layer may overlap the first refractive layer.

In an embodiment, the third refractive layer may have a planarized upper surface.

In an embodiment, the display device may further include an insulation layer between the second electrode and the first refractive layer, and being an inorganic insulation layer.

In an embodiment, the insulation layer may have a hydrophilic surface property.

A display device according to embodiments may include a first electrode, a pixel defining layer on the first electrode, the pixel defining layer having a pixel opening that exposes the first electrode, an emission layer in the pixel opening and on the first electrode, a second electrode on the emission layer, a first refractive layer on the second electrode, the first refractive layer overlapping the second electrode, a second refractive layer on the first refractive layer, the second refractive layer having a first refractive index and having a first opening that overlaps the pixel opening, and a third refractive layer on the second refractive layer, the third refractive layer overlapping the first refractive layer and having a second refractive index greater than the first refractive index.

In an embodiment, the display device may further include an insulation layer between the second electrode and the first refractive layer, and being an inorganic insulation layer. Each of the first refractive layer and the second refractive layer may be an organic refractive layer.

A display device according to embodiments may include a light emitting structure having an emission area and a non-emission area, a first refractive layer on the light emitting structure and being an organic refractive layer, a second refractive layer on the first refractive layer and being an organic refractive layer, the second refractive layer having a first refractive index and having a first opening that overlaps the emission area, and a third refractive layer on the second refractive layer, the third refractive layer having a second refractive index greater than the first refractive index.

In an embodiment, the first refractive layer may overlap the emission area and the non-emission area, and may have a planarized upper surface.

In an embodiment, the third refractive layer may overlap the first refractive layer, and may have a planarized upper surface.

According to the embodiments, the display device may include the first refractive layer overlapping the second electrode and being an organic refractive layer, the second refractive layer on the first refractive layer, being an organic refractive layer, having the first refractive index, and having the first opening that overlaps the pixel opening, and the third refractive layer on the second refractive layer, overlapping the first refractive layer and having the second refractive index greater than the first refractive index of the second refractive layer. Accordingly, a light emitted in a lateral direction of the display device may be totally reflected between the second refractive layer and the third refractive layer, and then may travel in a front direction of the display device. Therefore, light emitting efficiency of the display device may be improved.

BRIEF DESCRIPTION OF THE DRAWINGS

Illustrative, non-limiting embodiments will be more clearly understood from the following detailed description, taken in conjunction with the accompanying drawings.

DETAILED DESCRIPTION

Hereinafter, display devices in accordance with embodiments will be explained in more detail with reference to the accompanying drawings.

Hereinafter, a display device according to an embodiment will be described with reference to FIGS. 1, 2, 3, and 4.

Figure 1:
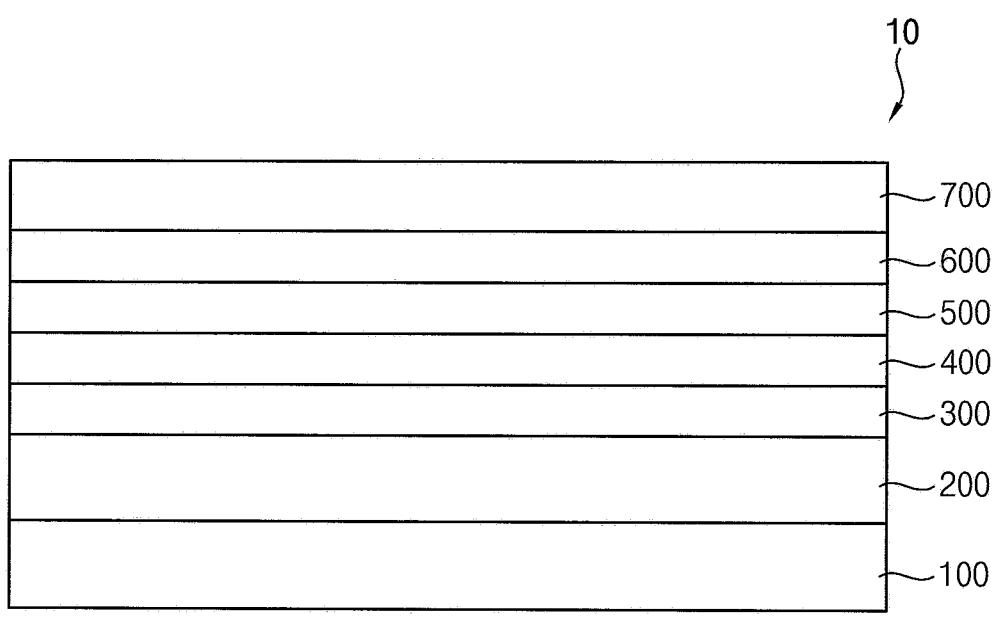
FIG. 1 is a cross-sectional view schematically illustrating a display device according to an embodiment.

FIG. 1 is a cross-sectional view schematically illustrating a display device according to an embodiment.

Referring to FIG. 1, the display device 10 may include a transistor substrate 100, a light emitting structure 200, an encapsulation structure 300, a sensing structure 400, a refractive structure 500, a polarizing layer 600, and a window 700.

The light emitting structure 200 may be disposed on the transistor substrate 100. The transistor substrate 100 may generate a driving current based on a data signal, a scan signal, a power voltage, etc., which are transmitted from an external device, and may provide the driving current to the light emitting structure 200. The light emitting structure 200 may generate light based on the driving current transmitted from the transistor substrate 100, and may emit the light.

The encapsulation structure 300 may be disposed on the light emitting structure 200. The encapsulation structure 300 may cover the light emitting structure 200, and may protect the light emitting structure 200 from external impurities such as moisture, oxygen, etc.

The sensing structure 400 may be disposed on the encapsulation structure 300. The sensing structure 400 may sense an external input such as an external object contacting or approaching the sensing structure 400. That is, the sensing structure 400 may sense an external input made through an external object contacting the sensing structure 400 or being close to the surface thereof.

The refractive structure 500 may be disposed on the sensing structure 400. The refractive structure 500 may control an optical path of the light generated from the light emitting structure 200. For example, the refractive structure 500 may control an optical path of light traveling in a lateral direction among the light emitted from the light emitting structure 200, so that the light (e.g., light initially traveling in the lateral direction) may travel in a front direction in which a user is located. Accordingly, brightness in the front direction of the display device 10 may increase, and light emitting efficiency of the display device 10 may be improved.

The polarizing layer 600 may be disposed on the refractive structure 500. The polarizing layer 600 may reduce reflection of external light of the display device 10. For example, when the external light, having passed through the polarizing layer 600, is reflected from below the polarizing layer 600 (e.g., is reflected from the light emitting structure 200) and then passes through the polarizing layer 600 again (i.e., as the incoming external light passes through the polarizing layer 600 the second time), a phase of the reflected external light may be changed. As a result, a phase of the reflected external light may be different from the phase of the incoming external light entering the polarizing layer 600 to the extent that a destructive interference occurs. Accordingly, the reflection of external light may be reduced to increase the visibility of the display device 10.

The window 700 may be disposed on the polarizing layer 600. The window 700 may protect the elements of the display device 10 from external impact, and may provide a display surface of the display device 10. In an embodiment, the window 700 may include glass, polymer resin (such as polycarbonate (PC), polymethyl methacrylate (PMMA), polyarylate (PAR), polyethersulfone (PES), polyethylene terephthalate (PET), polyethylene naphthalate (PEN), etc.), and/or the like.

Figure 2:
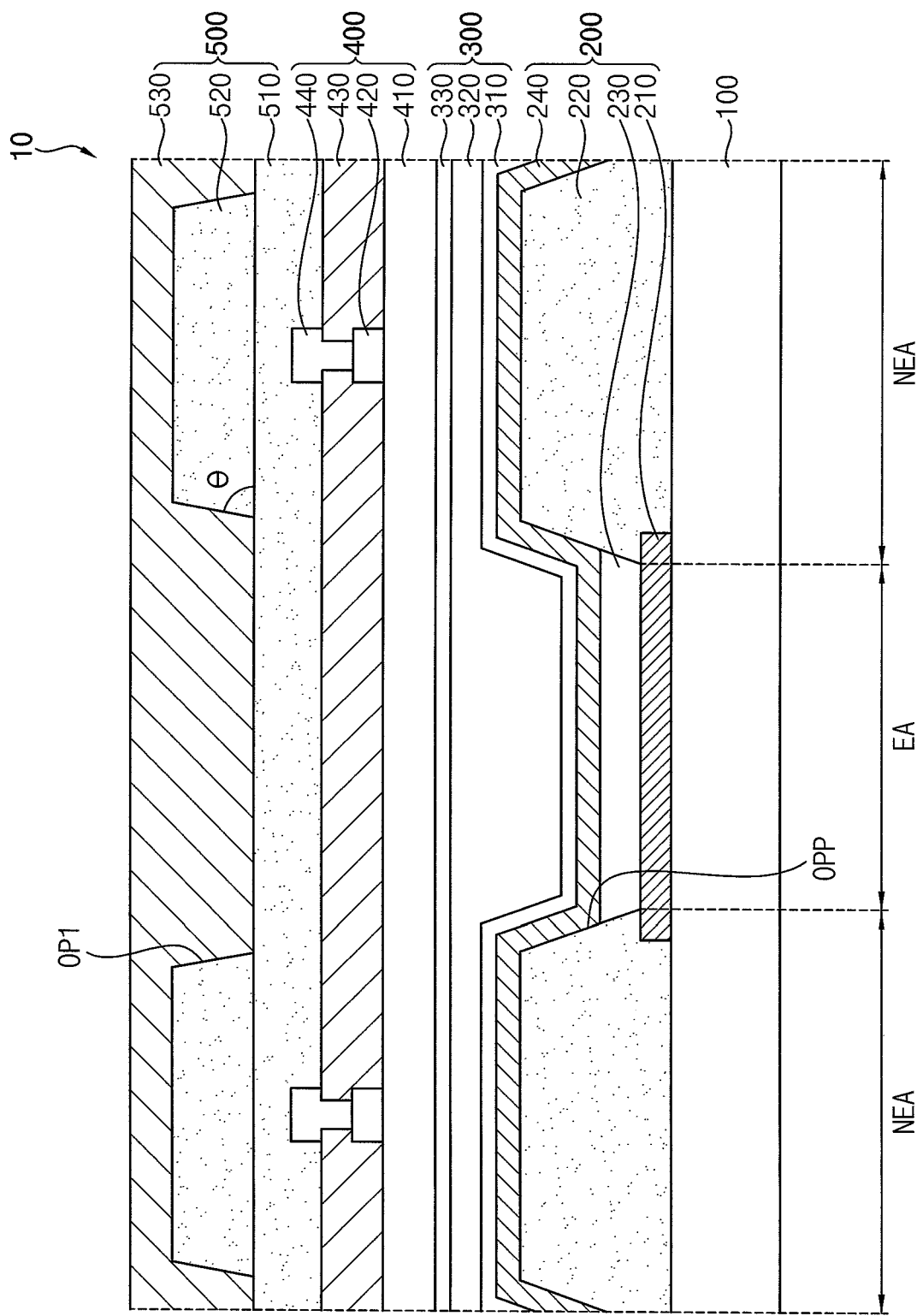
FIG. 2 is a cross-sectional view illustrating a display device according to an embodiment.

FIG. 2 is a cross-sectional view illustrating a display device according to an embodiment. FIG. 2 illustrates the transistor substrate 100, the light emitting structure 200, the encapsulation structure 300, the sensing structure 400, and the refractive structure 500 of the display device 10 in FIG. 1.

Referring to FIG. 2, the light emitting structure 200 may include a first electrode 210, a pixel defining layer 220, an emission layer 230, and a second electrode 240.

The transistor substrate 100 may include a base substrate and at least one thin film transistor disposed on the base substrate.

The first electrode 210 may be disposed on the transistor substrate 100. The first electrode 210 may be electrically connected to the thin film transistor included in the transistor substrate 100.

The pixel defining layer 220 may be disposed on the first electrode 210. The pixel defining layer 220 may be formed on the transistor substrate 100, and may cover (e.g., a portion of) the first electrode 210. The pixel defining layer 220 may have a pixel opening OPP that exposes the first electrode 210. For example, the pixel opening OPP may expose a center portion of the first electrode 210, and may cover a peripheral portion of the first electrode 210. The pixel defining layer 220 may define a pixel by having the pixel opening OPP that exposes the center portion of the first electrode 210. The pixel defining layer 220 may prevent or substantially prevent the occurrence of an arc at an edge of the first electrode 210 by increasing a distance between the edge of the first electrode 210 and second electrode 240 disposed above the first electrode 210. The pixel defining layer 220 may include an organic material such as polyimide (PI), hexamethyldisiloxane (HMDSO), etc.

The emission layer 230 may be disposed in the pixel opening OPP on the first electrode 210. The light emitting structure 200 may include an emission area EA defined by the pixel opening OPP in which the emission layer 230 is disposed and a non-emission area NEA neighboring the emission area EA.

The second electrode 240 may be disposed on the emission layer 230. The second electrode 240 may be formed on the emission layer 230 and the pixel defining layer 220. The second electrode 240 may be commonly formed in the emission area EA and the non-emission area NEA.

Light may be generated from the emission layer 230 by an electric field formed between the first electrode 210 and the second electrode 240, and the light may be emitted in a direction from the first electrode 210 to the second electrode 240. In this case, the first electrode 210 may be formed as a reflective layer, and the second electrode 240 may be formed as a semi-transmitting layer or a transmitting layer. The reflective layer and the semi-transmitting layer may include a metal such as magnesium (Mg), silver (Ag), gold (Au), calcium (Ca), lithium (Li), chromium (Cr), aluminum (Al), and/or an alloy thereof. The reflective layer and the semi-transmitting layer may be divided depending on a thickness. That is, depending on the thickness, the electrode may be a reflective layer or a semi-transmitting layer, and the semi-transmitting layer may have a thickness less than about 200 nm. The transmitting layer may include indium tin oxide (ITO), indium zinc oxide (IZO), zinc oxide (ZnO), indium oxide ($In_2O_3$), and/or the like.

In an embodiment, the light emitting structure 200 may further include at least one of a hole injection layer ("HIL") and a hole transport layer ("HTL"), which are disposed between the first electrode 210 and the emission layer 230, and/or at least one of an electron transport layer ("ETL") and an electron injection layer ("EIL"), which are disposed between the emission layer 230 and the second electrode 240.

The encapsulation structure 300 may include at least one inorganic encapsulation layer and at least one organic encapsulation layer. In an embodiment, the encapsulation structure 300 may include a first inorganic encapsulation layer 310, an organic encapsulation layer 320, and a second inorganic encapsulation layer 330.

The first inorganic encapsulation layer 310 may be disposed on the second electrode 240. The first inorganic encapsulation layer 310 may include aluminum oxide ($Al_2O_3$), silicon nitride ($SiN_x$), silicon oxide ($SiO_2$), etc. The first inorganic encapsulation layer 310 may be formed along a profile of the second electrode 240. That is, the first inorganic encapsulation layer 310 may be formed to completely cover the second electrode 240.

The organic encapsulation layer 320 may be disposed on the first inorganic encapsulation layer 310. The organic encapsulation layer 320 may include epoxy, acrylate, urethane acrylate, etc. The organic encapsulation layer 320 may have a planarized upper surface, therefore, the organic encapsulation layer 320 may planarize (e.g., provide a flat surface) above the second electrode 240.

The second inorganic encapsulation layer 330 may be disposed on the organic encapsulation layer 320. The second inorganic encapsulation layer 330 may be formed on the first inorganic encapsulation layer 310, and may cover the organic encapsulation layer 320. An edge of the second inorganic encapsulation layer 330 may be in contact with an edge of the first inorganic encapsulation layer 310. The second inorganic encapsulation layer 330 may include aluminum oxide ($Al_2O_3$), silicon nitride ($SiN_x$), silicon oxide ($SiO_2$), etc. In an embodiment, the second inorganic encapsulation layer 330 may include a material substantially the same as that of the first inorganic encapsulation layer 310.

The sensing structure 400 may include a base layer 410, a first conductive layer 420, an insulation layer 430, and a second conductive layer 440.

The base layer 410 may be disposed on the second inorganic encapsulation layer 330. The base layer 410 may be formed of an inorganic material. That is, the base layer 410 may be an inorganic base layer. For example, the inorganic material may include aluminum oxide, titanium oxide, silicon oxide, silicon oxynitride, zirconium oxide, hafnium oxide, and/or the like.

The first conductive layer 420 may be disposed on the base layer 410. The first conductive layer 420 may include a low resistance metal such as silver (Ag), aluminum (Al), copper (Cu), chromium (Cr), nickel (Ni), etc., or may include a conductive nano material such as silver nanowire, carbon nanotube, etc.

The insulation layer 430 may be disposed on the first conductive layer 420. The insulation layer 430 may be formed of an inorganic material. That is, the insulation layer 430 may be an inorganic insulation layer. For example, the inorganic material may include aluminum oxide, titanium oxide, silicon oxide, silicon oxynitride, zirconium oxide, hafnium oxide, and/or the like.

The second conductive layer 440 may be disposed on the insulation layer 430. The second conductive layer 440 may include a low resistance metal such as Ag, Al, Cu, Cr, Ni, etc., or may include a conductive nano material such as silver nanowire, carbon nanotube, etc. The second conductive layer 440 may be connected to the first conductive layer 420 through a contact hole formed in the insulation layer 430.

The first conductive layer 420 and the second conductive layer 440 may overlap the non-emission area NEA of the light emitting structure 200, and may not overlap the emission area EA of the light emitting structure 200. Accordingly, light emitted from the emission layer 230 of the light emitting structure 200 may not be affected by the sensing structure 400.

In an embodiment, the first conductive layer 420 and the second conductive layer 440 may include a sensing electrode (for outputting a sensing signal corresponding to an external input to a sensing driver) and a driving electrode (for receiving a driving signal from the sensing driver). For example, a first portion of the first conductive layer 420 and a first portion of the second conductive layer 440 connected to the first portion of the first conductive layer 420 may be the sensing electrode, and a second portion of the first conductive layer 420 and a second portion of the second conductive layer 440 connected to the second portion of the first conductive layer 420 may be the driving electrode.

The insulation layer 430 may have a hydrophilic surface property. In an embodiment, a conductive material may be deposited on the insulation layer 430, and then may be etched by utilizing a dry etching to form the second conductive layer 440. The insulation layer 430 may have a hydrophilic surface property when an etching material utilized in the dry etching is in contact with a surface of the insulation layer 430 during a process of forming the second conductive layer 440.

The refractive structure 500 may include a first refractive layer 510, a second refractive layer 520, and a third refractive layer 530.

The first refractive layer 510 may be disposed on the second conductive layer 440. The first refractive layer 510 may be formed on the insulation layer 430, and may cover the second conductive layer 440. The first refractive layer 510 may overlap the second electrode 240. In other words, the first refractive layer 510 may overlap the emission area EA and the non-emission area NEA of the light emitting structure 200.

The first refractive layer 510 may be formed of an organic material such as acryl and/or the like. The first refractive layer 510 may have a hydrophobic surface property. For example, the first refractive layer 510 may have a surface property different from that of the insulation layer 430 (which has the hydrophilic surface property). The first refractive layer 510 may have a planarized upper surface. Accordingly, the first refractive layer 510 may provide a planarized surface to the second refractive layer 520 disposed on the first refractive layer 510.

The first refractive layer 510 may be formed by coating an organic material on the insulation layer 430 (on which the second conductive layer 440 is formed) and then conducting light-curing of the organic material, etc. That is, the first refractive layer 510 may be an organic refractive layer. Also, by the light-curing, a chemical resistance of the first refractive layer 510 may increase, and an amount of outgas generated from the first refractive layer 510 may decrease.

The second refractive layer 520 may be disposed on the first refractive layer 510. The second refractive layer 520 may have a first opening OP1 overlapping the pixel opening OPP. For example, the first opening OP1 may overlap the emission area EA of the light emitting structure 200.

The second refractive layer 520 may be formed of an organic material such as acryl and/or the like. That is, the second refractive layer 520 may be an organic refractive layer. The second refractive layer 520 may have a hydrophobic surface property. For example, the second refractive layer 520 may have a surface property substantially the same as that of the first refractive layer 510 (which has the hydrophobic surface property).

In an embodiment, the second refractive layer 520 may include a material substantially the same as that of the first refractive layer 510. However, the present disclosure is not limited thereto, and in another embodiment, the second refractive layer 520 may include a material different from that of the first refractive layer 510.

An inclination angle (e) of a sidewall of the second refractive layer 520 with respect to an upper surface of the first refractive layer 510 may be an acute angle. In other words, the inclination angle ($\theta$) of the sidewall of the second refractive layer 520 with respect to the upper surface of the first refractive layer 510 may be greater than 0 degree and less than 90 degrees. Accordingly, an under-cut may not be formed at the sidewall of the second refractive layer 520.

The second refractive layer 520 may be formed by coating an organic material on the first refractive layer 510, patterning the organic material, and then conducting light-curing of the organic material, etc. By the light-curing, a chemical resistance of the second refractive layer 520 may increase, and an amount of outgas generated from the second refractive layer 520 may decrease.

Figure 3:
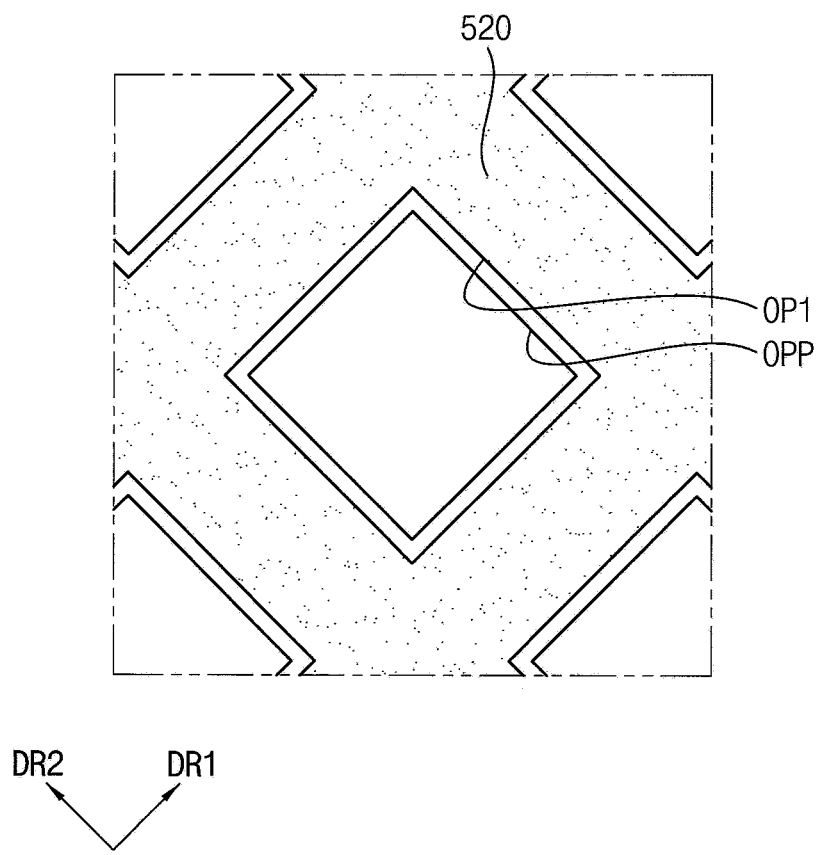
FIG. 3 is a plan view illustrating a refractive structure included in the display device in FIG. 2.

FIG. 3 is a plan view illustrating the second refractive layer 520 of the refractive structure 500 included in the display device 10 in FIG. 2.

Referring to FIGS. 2 and 3, the second refractive layer 520 may have a grid shape overlapping the pixel defining layer 220 in a plan view. For example, the second refractive layer 520 may extend along a first direction DR1 and a second direction DR2 crossing the first direction DR1 in a plan view, and the second refractive layer 520 may surround the pixel opening OPP of the pixel defining layer 220 in a plan view. In this case, an area of the first opening OP1 of the second refractive layer 520 may be greater than an area of the pixel opening OPP of the pixel defining layer 220.

Referring to FIG. 2 again, the third refractive layer 530 may be disposed on the second refractive layer 520. The third refractive layer 530 may be formed on the first refractive layer 510, and may cover the second refractive layer 520. The third refractive layer 530 may overlap the first refractive layer 510. For example, the third refractive layer 530 may overlap the emission area EA and the non-emission area NEA of the light emitting structure 200.

The third refractive layer 530 may include an organic material such as acryl and/or the like, and may further include at least one of zirconium oxide ($ZrO_x$) particles, aluminum oxide ($AlO_x$) particles, and titanium oxide ($TiO_x$) particles to increase a refractive index of the third refractive layer 530. The third refractive layer 530 may have a planarized upper surface. Accordingly, the third refractive layer 530 may provide a planarized surface to the polarizing layer 600 in FIG. 1 (disposed over the refractive structure 500).

The third refractive layer 530 may have a second refractive index greater than a first refractive index of the second refractive layer 520. In an embodiment, the first refractive index may be about 1.5, and the second refractive index may be about 1.65. Because the second refractive index of the third refractive layer 530 is greater than the first refractive index of the second refractive layer 520, light emitted from the light emitting structure 200 may be refracted or reflected at an interface between the second refractive layer 520 and the third refractive layer 530. Therefore, the refractive structure 500 may control an optical path of the light emitted from the light emitting structure 200.

Figure 4:
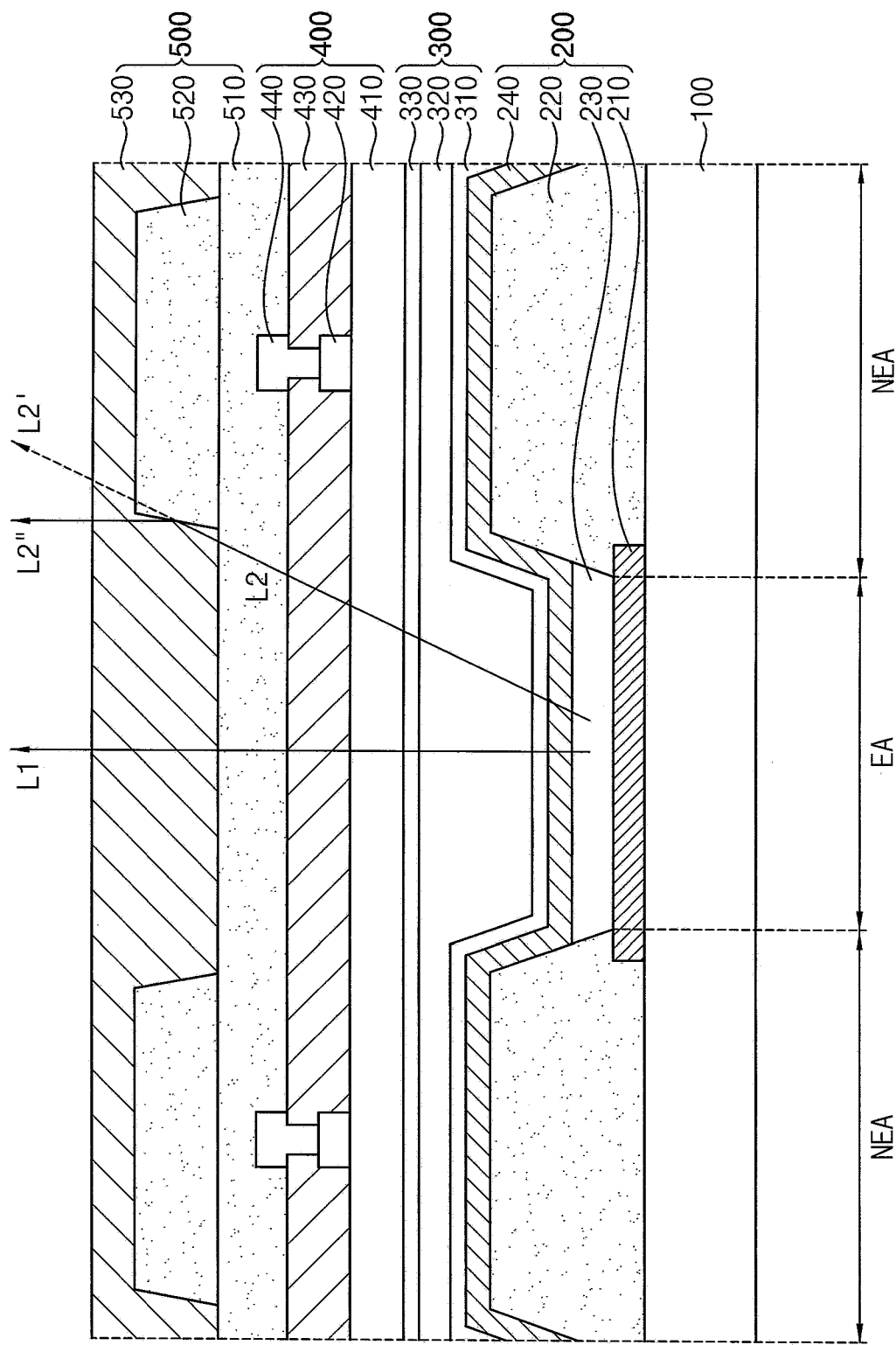
FIG. 4 is a cross-sectional view illustrating an emission of light in the display device in FIG. 2.

FIG. 4 is a cross-sectional view illustrating an emission of light in the display device 10 in FIG. 2.

Referring to FIGS. 2 and 4, light emitted from the emission layer 230 of the light emitting structure 200 may travel in various suitable directions. The light emitted from the emission layer 230 may include a front light L1 emitted toward a front surface of the display device 10 and a lateral light L2 emitted toward a side of the display device 10.

When the display device 10 does not include the refractive structure 500, the lateral light L2 may not be refracted, and may be emitted in a lateral direction of the display device 10 as the lateral light L2'. Accordingly, a direction of the front light L1 and a direction of the lateral light L2' may be different from each other, and brightness in the front direction of the display device 10 may decrease.

However, the display device 10 according to an embodiment may include the refractive structure 500, the lateral light L2 may be totally reflected at the sidewall of the second refractive layer 520 based on a difference between the refractive index of the second refractive layer 520 and the refractive index of the third refractive layer 530, and the lateral light L2" may be emitted in the front direction of the display device 10. Accordingly, a direction of the front light L1 and a direction of the lateral light L2" may be substantially the same as each other, and brightness in the front direction of the display device 10 may increase.

In a comparative example of the prior art, when the refractive structure 500 does not include the first refractive layer 510, and the second refractive layer 520 is disposed directly on the insulation layer 430, a developer utilized in a process of forming the second refractive layer 520 may penetrate between the insulation layer 430 and the second refractive layer 520 to form an undercut at the sidewall of the second refractive layer 520 because an interface energy between the insulation layer 430 having the hydrophilic surface property and the second refractive layer 520 having the hydrophobic surface property is relatively low. When the undercut is formed at the sidewall of the second refractive layer 520, the lateral light may not be totally reflected by the sidewall of the second refractive layer 520, and may not be emitted in the front direction of the display device. Accordingly, a direction of the front light and a direction of the lateral light may be different from each other, and light emitting efficiency of the display device may decrease.

However, in an embodiment of the present disclosure, a developer utilized in a process of forming the second refractive layer 520 may not penetrate between the first refractive layer 510 and the second refractive layer 520, and an undercut may not be formed at the sidewall of the second refractive layer 520 because the first refractive layer 510 is disposed between the insulation layer 430 and the second refractive layer 520, and an interface energy between the first refractive layer 510 having the hydrophobic surface property and the second refractive layer 520 having the hydrophobic surface property is relatively high. When the undercut is not formed at the sidewall of the second refractive layer 520, the lateral light may be totally reflected by the sidewall of the second refractive layer 520 and may be emitted in the front direction of the display device 10. Accordingly, a direction of the front light and a direction of the lateral light (e.g., the lateral light after being reflected) may be substantially the same as each other, and light emitting efficiency of the display device 10 may increase.

Hereinafter, a display device 11 according to another embodiment will be described with reference to FIGS. 5, 6, and 7. Descriptions on elements of the display device 11 described with reference to FIGS. 5, 6, and 7, which are substantially the same as or similar to those of the display device 10 described with reference to FIGS. 1, 2, 3, and 4, may not be repeated.

Figure 5:
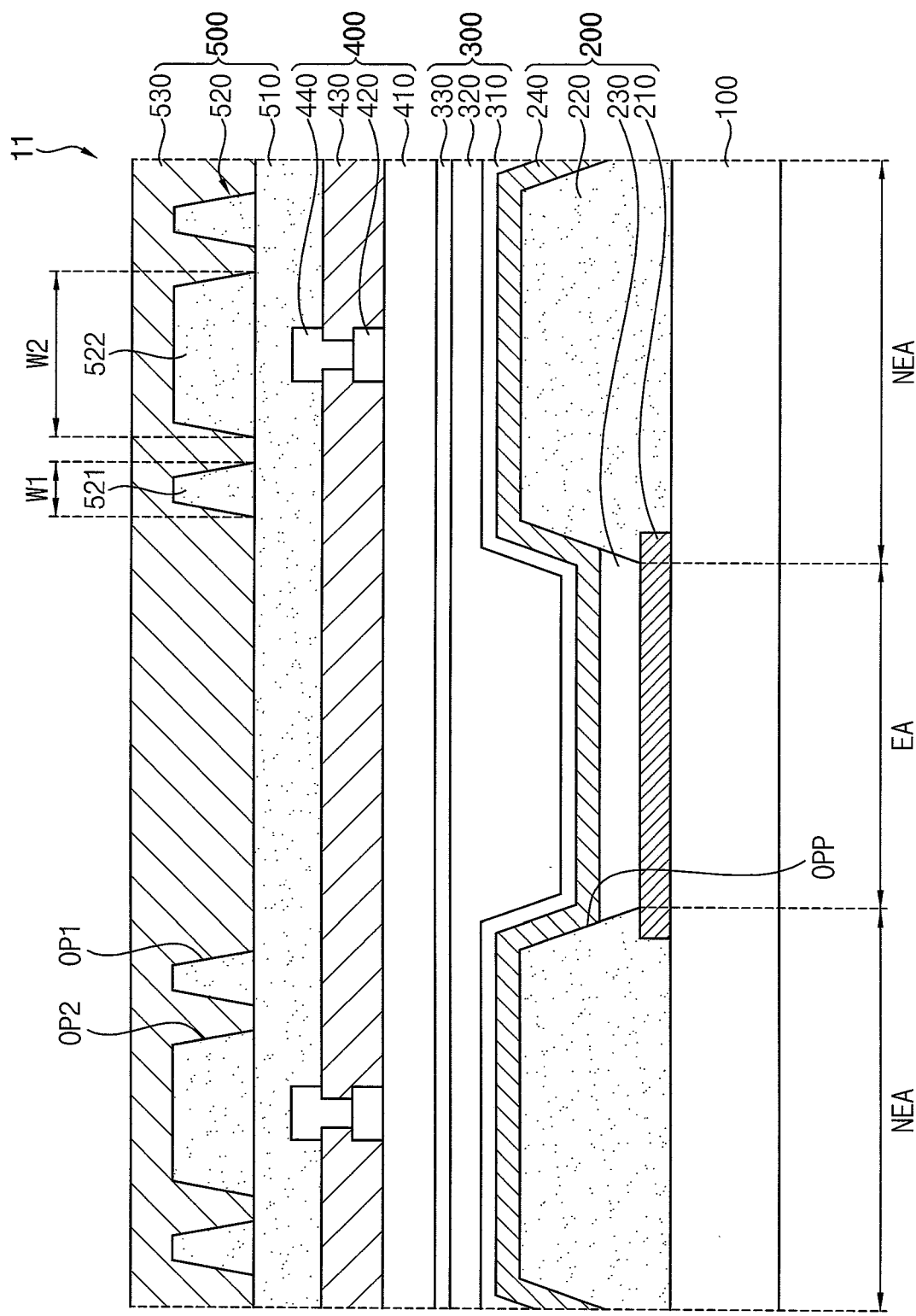
FIG. 5 is a cross-sectional view illustrating a display device according to another embodiment.

FIG. 5 is a cross-sectional view illustrating a display device 11 according to another embodiment.

Referring to FIG. 5, the second refractive layer 520 may include a plurality of refractive patterns 521 and 522. In an embodiment, the second refractive layer 520 may include a first refractive pattern 521 and a second refractive pattern 522.

The first refractive pattern 521 may have a first opening OP1 overlapping the pixel opening OPP. For example, the first opening OP1 may overlap the emission area EA of the light emitting structure 200.

The second refractive pattern 522 may be spaced apart from the first refractive pattern 521, and may surround the first refractive pattern 521. Accordingly, the second refractive pattern 522 may have a second opening OP2 greater (e.g., in area) than the first opening OP1. For example, a width of the second opening OP2 may be greater than a width of the first opening OP1.

In an embodiment, a width W2 of the second refractive pattern 522 may be greater than a width W1 of the first refractive pattern 521. However, the present disclosure is not limited thereto, and in another embodiment, the width W2 of the second refractive pattern 522 may be less than or substantially equal to the width W1 of the first refractive pattern 521.

Figure 6:
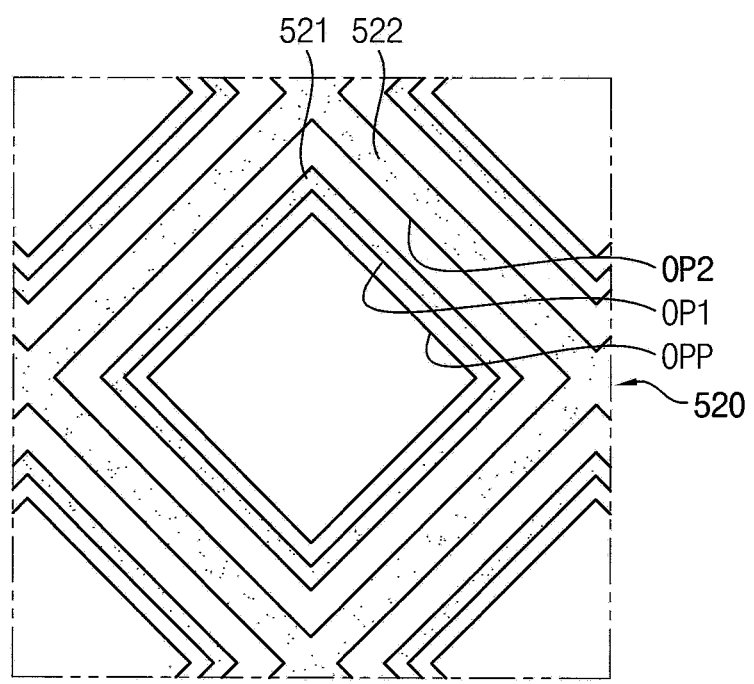
FIG. 6 is a plan view illustrating a refractive structure included in the display device in FIG. 5.
Figure 6:
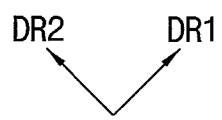

FIG. 6 is a plan view illustrating the second refractive layer 520 of the refractive structure 500 included in the display device 11 in FIG. 5.

Referring to FIGS. 5 and 6, the first refractive pattern 521 may have a ring shape surrounding the pixel opening OPP in a plan view, and the second refractive pattern 522 may have a grid shape overlapping the pixel defining layer 220 in a plan view. For example, the first refractive pattern 521 may surround the pixel opening OPP of the pixel defining layer 220 in a plan view. Further, the second refractive pattern 522 may extend along the first direction DR1 and the second direction DR2 in a plan view, and the second refractive pattern 522 may surround the first opening OP1 of the first refractive pattern 521 in a plan view. In this case, an area of the first opening OP1 of the first refractive pattern 521 may be greater than an area of the pixel opening OPP of the pixel defining layer 220, and an area of the second opening OP2 of the second refractive pattern 522 may be greater than the area of the first opening OP1 of the first refractive pattern 521.

Figure 7:
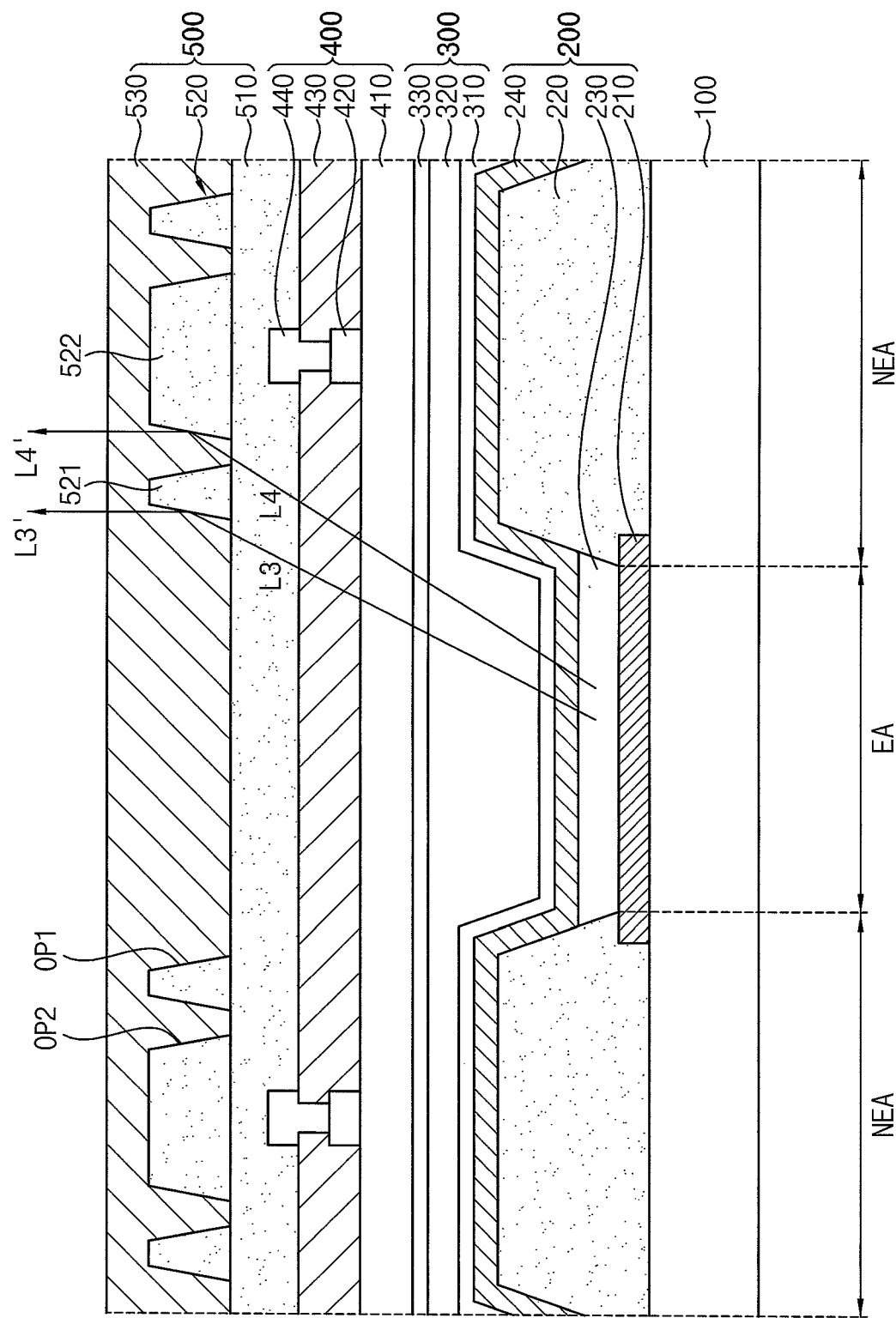
FIG. 7 is a cross-sectional view illustrating an emission of light in the display device in FIG. 5.

FIG. 7 is a cross-sectional view illustrating an emission of light in the display device 11 in FIG. 5.

Referring to FIGS. 5 and 7, light emitted toward a side of the display device 11 from the emission layer 230 of the light emitting structure 200 may include a plurality of lateral light L3 and L4. In the present embodiment, the second refractive layer 520 may include the plurality of refractive patterns 521 and 522, and the lateral light L3 and L4 may be totally reflected at a sidewall of the first refractive pattern 521 and a sidewall of the second refractive pattern 522, respectively, and the lateral light L3' and L4' may be emitted in a front direction of the display device 11. Accordingly, brightness in the front direction of the display device 11 may further increase.

Hereinafter, a display device 12 according to still another embodiment will be described with reference to FIGS. 8 and 9. Descriptions on elements of the display device 12 described with reference to FIGS. 8 and 9, which are substantially the same as or similar to those of the display device 10 described with reference to FIGS. 1, 2, 3, and 4, may not be repeated.

Figure 8:
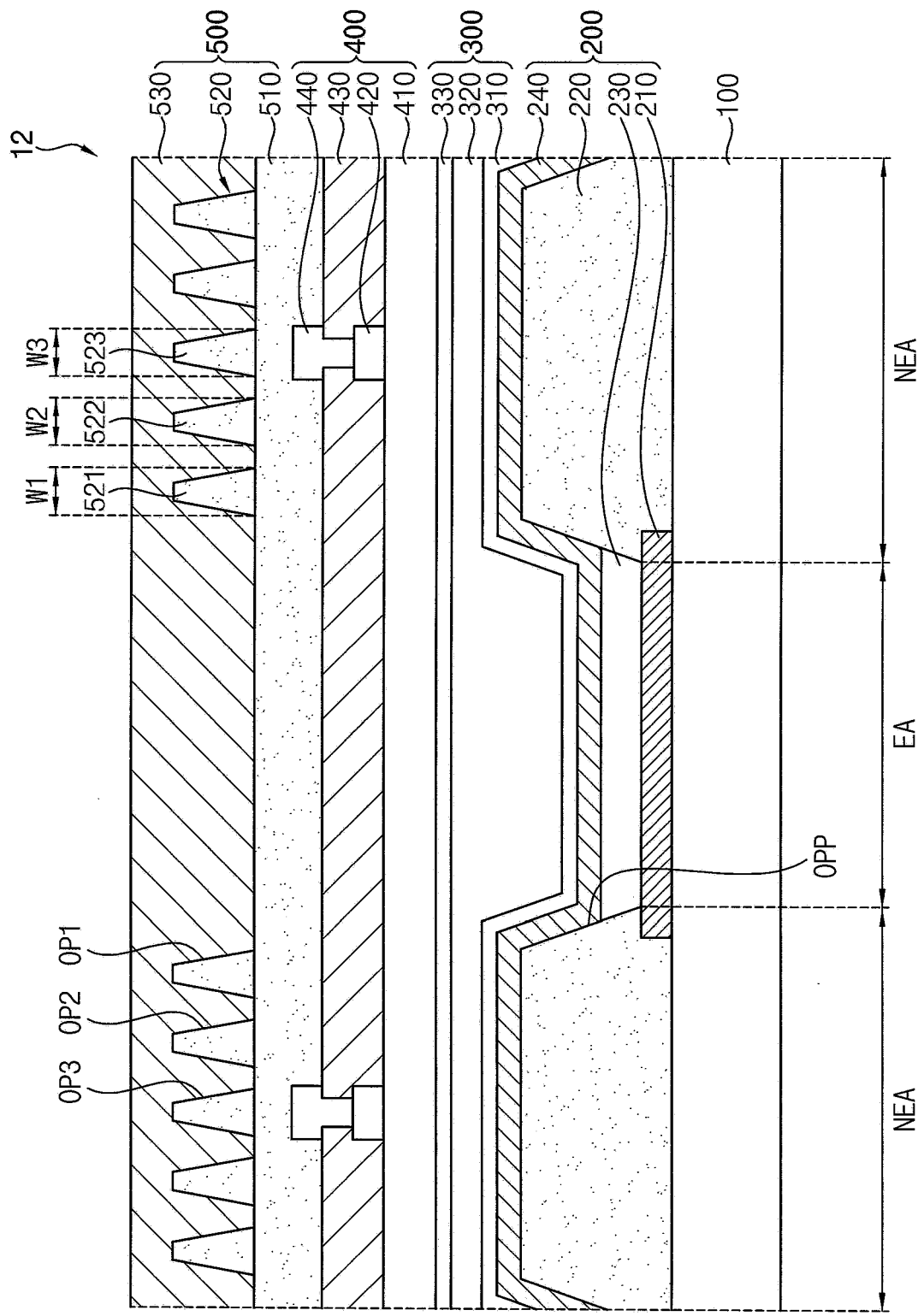
FIG. 8 is a cross-sectional view illustrating a display device according to still another embodiment.

FIG. 8 is a cross-sectional view illustrating a display device 12 according to still another embodiment.

Referring to FIG. 8, the second refractive layer 520 may include a plurality of refractive patterns 521, 522, and 523. In an embodiment, the second refractive layer 520 may include a first refractive pattern 521, a second refractive pattern 522, and a third refractive pattern 523.

The first refractive pattern 521 may have a first opening OP1 overlapping the pixel opening OPP. For example, the first opening OP1 may overlap the emission area EA of the light emitting structure 200.

The second refractive pattern 522 may be spaced apart from the first refractive pattern 521, and may surround the first refractive pattern 521. Accordingly, the second refractive pattern 522 may have a second opening OP2 greater (e.g., in area) than the first opening OP1. For example, a width of the second opening OP2 may be greater than a width of the first opening OP1.

The third refractive pattern 523 may be spaced apart from the second refractive pattern 522, and may surround the second refractive pattern 522. Accordingly, the third refractive pattern 523 may have a third opening OP3 greater (e.g., in area) than the second opening OP2. For example, a width of the third opening OP3 may be greater than a width of the second opening OP2.

In an embodiment, a width W1 of the first refractive pattern 521, a width W2 of the second refractive pattern 522, and a width W3 of the third refractive pattern 523 may be substantially equal to each other. However, the present disclosure is not limited thereto, and in another embodiment, the width W1 of the first refractive pattern 521, the width W2 of the second refractive pattern 522, and the width W3 of the third refractive pattern 523 may be different from each other.

Figure 9:
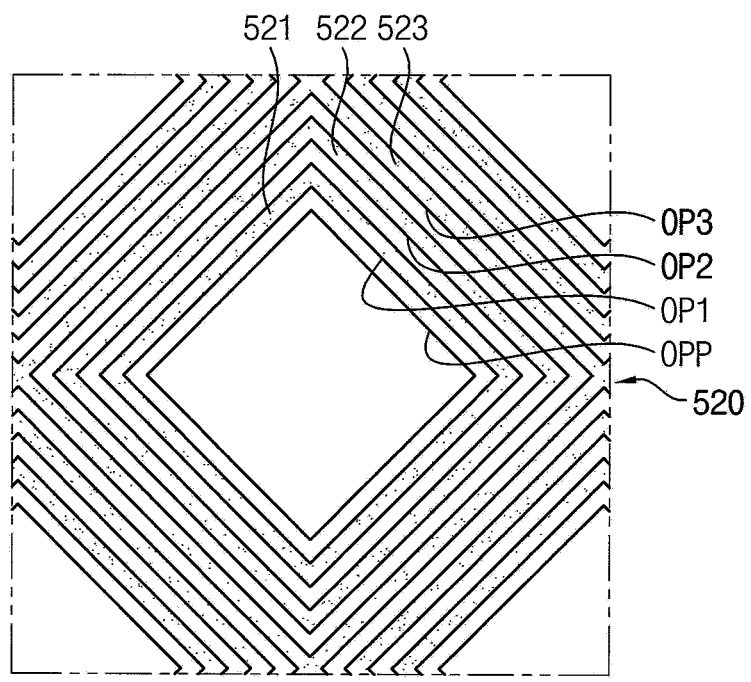
FIG. 9 is a plan view illustrating a refractive structure included in the display device in FIG. 8.
Figure 9:
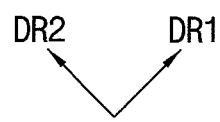

FIG. 9 is a plan view illustrating the second refractive layer 520 of the refractive structure 500 included in the display device 12 in FIG. 8.

Referring to FIGS. 8 and 9, the first refractive pattern 521 may have a ring shape surrounding the pixel opening OPP in a plan view, the second refractive pattern 522 may have a ring shape surrounding the first opening OP1 in a plan view, and the third refractive pattern 523 may have a grid shape overlapping the pixel defining layer 220 in a plan view. For example, the first refractive pattern 521 may be around (or surround) the pixel opening OPP of the pixel defining layer 220 in a plan view, and the second refractive pattern 522 may be around (or surround) the first opening OP1 of the first refractive pattern 521 in a plan view. Further, the third refractive pattern 523 may extend along the first direction DR1 and the second direction DR2 in a plan view, and the third refractive pattern 523 may be around (or surround) the second opening OP2 of the second refractive pattern 522 in a plan view. In this case, an area of the first opening OP1 of the first refractive pattern 521 may be greater than an area of the pixel opening OPP of the pixel defining layer 220, an area of the second opening OP2 of the second refractive pattern 522 may be greater than the area of the first opening OP1 of the first refractive pattern 521, and an area of the third opening OP3 of the third refractive pattern 523 may be greater than the area of the second opening OP2 of the second refractive pattern 522.

In a comparative example of the prior art, when the refractive structure 500 does not include the first refractive layer 510, and the second refractive layer 520 is disposed directly on the insulation layer 430, a developer utilized in a process of forming the second refractive layer 520 may penetrate between the insulation layer 430 and the second refractive layer 520 to form an undercut at the sidewall of the second refractive layer 520 because an interface energy between the insulation layer 430 having the hydrophilic surface property and the second refractive layer 520 having the hydrophobic surface property is relatively low. The undercut may be removed when the second refractive layer 520 is thermally cured, however, a width of each of the refractive patterns may increase so that a relatively large amount (e.g., number) of refractive patterns may not be formed. That is, due to the expansion in the width of each of the refractive patterns as a result of the thermal curing process, the spacing between the refractive patterns needs to be greater (to accommodate the expansion), and therefore less number of refractive patterns can be formed.

However, in an embodiment of the present disclosure, a developer utilized in a process of forming the second refractive layer 520 may not penetrate between the first refractive layer 510 and the second refractive layer 520, and an undercut may not be formed at the sidewall of the second refractive layer 520 because the first refractive layer 510 is disposed between the insulation layer 430 and the second refractive layer 520, and an interface energy between the first refractive layer 510 having the hydrophobic surface property and the second refractive layer 520 having the hydrophobic surface property is relatively high. Accordingly, thermal curing of the second refractive layer 520 to remove the undercut may not be required, and the second refractive layer 520 may include a relatively large amount of the refractive patterns 521, 522, and 523.

The display device according to the embodiments may be applied to a display device included in a computer, a notebook, a mobile phone, a smartphone, a smart pad, a portable media player (PMP), a personal digital assistant (PDA), an MP3 player, and/or the like.

Expressions such as "at least one of" or "at least one selected from" when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration. It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. In contrast, when an element or layer is referred to as being "directly on," "directly connected to", "directly coupled to", or "immediately adjacent to" another element or layer, there are no intervening elements or layers present. As used herein, the term "substantially," "about," and similar terms are used as terms of approximation and not as terms of degree, and are intended to account for the inherent deviations in measured or calculated values that would be recognized by those of ordinary skill in the art.

Although the display device according to the embodiments have been described with reference to the drawings, the illustrated embodiments are examples, and may be modified and changed by a person having ordinary knowledge in the relevant technical field without departing from the technical spirit described in the following claims, and equivalents thereof.

What is claimed is:

1. A display device, comprising:
   a first electrode;
   a pixel defining layer on the first electrode, the pixel defining layer having a pixel opening that exposes the first electrode;
   an emission layer in the pixel opening and on the first electrode;
   a second electrode on the emission layer;
   a first refractive layer on the second electrode and being an organic refractive layer;
   a second refractive layer on the first refractive layer and being an organic refractive layer, the second refractive layer having a first refractive index and having a first opening that overlaps the pixel opening; and
   a third refractive layer on the second refractive layer, the third refractive layer having a second refractive index greater than the first refractive index,
   wherein the second refractive layer comprises a plurality of refractive patterns, and
   wherein gaps between the plurality of refractive patterns overlap the pixel defining layer and do not overlap the pixel opening.

2. The display device of claim 1, wherein each of the first refractive layer and the second refractive layer has a hydrophobic surface.

3. The display device of claim 1, wherein an inclination angle of a sidewall of the second refractive layer with respect to an upper surface of the first refractive layer is an acute angle.

4. The display device of claim 1, wherein the second refractive layer comprises:
   a first refractive pattern having the first opening; and a second refractive pattern around the first refractive pattern and having a second opening greater in area than the first opening.

5. The display device of claim 4, wherein the first refractive pattern has a ring shape around the pixel opening in a plan view, and
wherein the second refractive pattern has a grid shape overlapping the pixel defining layer in a plan view.

6. The display device of claim 4, wherein the second refractive pattern is greater in width than the first refractive pattern.

7. The display device of claim 4, wherein the second refractive layer further comprises a third refractive pattern around the second refractive pattern and having a third opening greater in area than the second opening.

8. The display device of claim 7, wherein the first refractive pattern, the second refractive pattern, and the third refractive pattern are equal to each other in width.

9. The display device of claim 1, wherein the first refractive layer overlaps the second electrode.

10. The display device of claim 1, wherein the first refractive layer has a planarized upper surface.

11. The display device of claim 1, wherein the third refractive layer overlaps the first refractive layer.

12. The display device of claim 1, wherein the third refractive layer has a planarized upper surface.

13. The display device of claim 1, further comprising:
an insulation layer between the second electrode and the first refractive layer, and being an inorganic insulation layer.

14. The display device of claim 13, wherein the insulation layer has a hydrophilic surface.

15. A display device, comprising:
a first electrode;
a pixel defining layer on the first electrode, the pixel defining layer having a pixel opening that exposes the first electrode;
an emission layer in the pixel opening and on the first electrode;
a second electrode on the emission layer;
a first refractive layer on the second electrode, the first refractive layer overlapping the second electrode;
a second refractive layer on the first refractive layer, the second refractive layer having a first refractive index and having a first opening that overlaps the pixel opening; and
a third refractive layer on the second refractive layer, the third refractive layer overlapping the first refractive layer and having a second refractive index greater than the first refractive index,
wherein the second refractive layer comprises a plurality of refractive patterns, and
wherein gaps between the plurality of refractive patterns overlap the pixel defining layer and do not overlap the pixel opening.

16. The display device of claim 15, further comprising:
an insulation layer between the second electrode and the first refractive layer, and being an inorganic insulation layer,
wherein each of the first refractive layer and the second refractive layer is an organic refractive layer.

17. A display device, comprising:
a light emitting structure having an emission area and a non-emission area;
a pixel defining layer defining the emission area;
a first refractive layer on the light emitting structure and being an organic refractive layer;
a second refractive layer on the first refractive layer and being an organic refractive layer, the second refractive layer having a first refractive index and having a first opening that overlaps the emission area; and
a third refractive layer on the second refractive layer, the third refractive layer having a second refractive index greater than the first refractive index,
wherein the second refractive layer comprises a plurality of refractive patterns, and
wherein gaps between the plurality of refractive patterns overlap the pixel defining layer and do not overlap the first opening.

18. The display device of claim 17, wherein the first refractive layer overlaps the emission area and the non-emission area, and has a planarized upper surface.

19. The display device of claim 18, wherein the third refractive layer overlaps the first refractive layer and has a planarized upper surface.

* * * * *